(12) United States Patent
Reinmuth et al.

(10) Patent No.: US 10,913,652 B2
(45) Date of Patent: Feb. 9, 2021

(54) MICROMECHANICAL Z-INERTIAL SENSOR

(71) Applicant: Robert Bosch GmbH, Stuttgart (DE)

(72) Inventors: Jochen Reinmuth, Reutlingen (DE); Matthias Kuehnel, Boeblingen (DE)

(73) Assignee: Robert Bosch GmbH, Stuttgart (DE)

( * ) Notice: Subject to any disclaimer, the term of this patent is extended or adjusted under 35 U.S.C. 154(b) by 232 days.

(21) Appl. No.: 16/173,087

(22) Filed: Oct. 29, 2018

(65) Prior Publication Data

US 2019/0135613 A1 May 9, 2019

(30) Foreign Application Priority Data

Nov. 9, 2017 (DE) .................. 10 2017 219 901

(51) Int. Cl.
*B81B 3/00* (2006.01)
*G01P 15/18* (2013.01)
(Continued)

(52) U.S. Cl.
CPC ............ *B81B 3/0072* (2013.01); *B81B 3/007* (2013.01); *B81B 3/0086* (2013.01); *B81C 1/00166* (2013.01); *B81C 1/00349* (2013.01); *B81C 1/00666* (2013.01); *G01P 15/0802* (2013.01); *G01P 15/125* (2013.01); *G01P 15/18* (2013.01); *B81B 2201/025* (2013.01); *B81B 2201/0235* (2013.01); *B81B 2203/0163* (2013.01);
(Continued)

(58) Field of Classification Search
CPC ..... B81B 3/007; B81B 3/0072; B81B 3/0086; B81B 2201/0235; B81B 2201/025; B81B 2203/0163; B81C 1/00166; B81C 1/00349; B81C 1/00666; G01P 15/0802; G01P 15/125; G01P 15/18; G01P 2015/0831; G01P 2015/0862
See application file for complete search history.

(56) References Cited

U.S. PATENT DOCUMENTS 6,215,318 B1 * 4/2001 Schoefthaler ...... G01R 33/0035
324/658
7,767,483 B1 8/2010 Waters
(Continued)

FOREIGN PATENT DOCUMENTS

DE 102010029708 A1 12/2011
DE 102015200626 B3 7/2016
EP 2184583 B1 5/2010

*Primary Examiner* — Ryan D Walsh
(74) *Attorney, Agent, or Firm* — Norton Rose Fulbright US LLP; Gerard Messina

(57) ABSTRACT

A micromechanical z-inertial sensor having a movable MEMS structure developed in a second function layer; first spring elements developed in a first function layer, and a first electrode developed in the first function layer, the first spring elements being connected to the movable MEMS structure and to a substrate, and the first function layer being situated below the second function layer; second spring elements developed in a third function layer, and a second electrode developed in the third function layer, the second spring elements being connected to the movable MEMS structure and to the substrate, and the third function layer being disposed above the second function layer; the movable MEMS structure being deflectable in the z-direction with the aid of the spring elements, and in a defined manner, not being deflectable in the x- and y-directions.

10 Claims, 10 Drawing Sheets

(51) Int. Cl.
    *G01P 15/125*    (2006.01)
    *B81C 1/00*      (2006.01)
    *G01P 15/08*     (2006.01)

(52) U.S. Cl.
    CPC ............... *G01P 2015/0831* (2013.01); *G01P 2015/0862* (2013.01)

(56) References Cited

U.S. PATENT DOCUMENTS

| | | | | |
|---|---|---|---|---|
| 8,806,940 | B2 * | 8/2014 | Classen | G01P 15/0802 |
| | | | | 73/514.29 |
| 9,709,451 | B2 * | 7/2017 | Kaelberer | G01L 9/0072 |
| 2008/0061808 | A1 * | 3/2008 | Mok | G01R 1/07357 |
| | | | | 324/754.14 |
| 2013/0180332 | A1 * | 7/2013 | Jia | G01C 19/5762 |
| | | | | 73/504.12 |
| 2015/0198493 | A1 * | 7/2015 | Kaelberer | B81B 3/0037 |
| | | | | 73/718 |
| 2019/0135612 | A1 * | 5/2019 | Boessendoerfer | B81B 7/02 |
| 2019/0146003 | A1 * | 5/2019 | Reinmuth | G01P 15/125 |
| | | | | 73/514.24 |
| 2019/0383853 | A1 * | 12/2019 | Reinmuth | G01P 15/125 |

* cited by examiner

MICROMECHANICAL Z-INERTIAL SENSOR

CROSS REFERENCE

The present application claims the benefit under 35 U.S.C. § 119 of German Patent Application No. DE 102017219901.6 filed on Nov. 9, 2017, which is expressly incorporated herein by reference in its entirety.

FIELD

The present invention relates to a micromechanical z-inertial sensor. In addition, the present invention relates to a method for producing a micromechanical z-inertial sensor.

BACKGROUND INFORMATION

Micromechanical z-inertial sensors having MEMS structures have been available for a long time. They may have a rocker structure which is developed in a function layer and is attached to the substrate via torsion springs. Generally, the mass distribution of the rocker structure is developed asymmetrically, and two electrode surfaces are situated underneath the rocker so that the deflection of the rocker structure is able to be measured in a capacitive manner. One disadvantage of this system is that the asymmetrical mass suspended at the torsion springs reacts not just to an acceleration in the z-direction.

SUMMARY

It is an object of the present invention to provide a micromechanical z-inertial sensor which exhibits an improved sensing behavior.

According to a first aspect of the present invention, this objective is achieved by a micromechanical z-inertial sensor, which includes:
  A movable MEMS structure, which is developed in a second function layer;
  First spring elements, which are developed in a first function layer, and a first electrode, which is developed in the first function layer, the first spring elements being connected to the movable MEMS structure and to a substrate, and the first function layer being situated below the second function layer;
  Second spring elements, which are developed in a third function layer, and a second electrode, which is developed in the third function layer, the second spring elements being connected to the movable MEMS structure and to the substrate, and the third function layer being situated above the second function layer;
  The movable MEMS structure is deflectable in the z-direction with the aid of the spring elements, and in a defined manner, it is not deflectable in the x- and in the y-directions.

In this way a micromechanical z-inertial sensor is provided which has a movable MEMS structure in the form of a plate. In view of the facts that the seismic mass is able to generate a larger sensor signal with increasing thickness and the electrode surfaces are situated directly on top of one another, it is advantageously possible to produce a sensitive, space-saving sensor. The movable mass element and the springs are represented in different planes, which makes it possible to increase a thicker mass without any resulting adverse change in the spring stiffness, as is the case with the conventional rocker design.

In an advantageous manner, this makes it possible to linearly increase the sensitivity of the sensor with the layer thickness, the deflection mass simultaneously representing the detection mass. As a result, a capacitive evaluation principle is thereby able to be provided in an advantageous manner, which has electrode surfaces that are halved in comparison with the rocker principle.

According to a second aspect of the present invention, the objective is achieved by a method for producing a micromechanical z-inertial sensor, the method having the following steps:
  Providing a movable MEMS structure, which is developed in a second function layer;
  Providing first spring elements, which are developed in a first function layer, and a first electrode, which is developed in the first function layer, the first spring elements being connected to the movable MEMS structure and to a substrate, and the first function layer being situated below the second function layer;
  Providing second spring elements, which are developed in a third function layer, and a second electrode, which is developed in the third function layer, the second spring elements being connected to the movable MEMS structure and to the substrate, and the third function layer being situated above the second function layer;
  The movable MEMS structure is deflectable in the z-direction with the aid of the spring elements, and in a defined manner, it is not deflectable in the x- and y-directions.

Preferred further developments of the micromechanical z-inertial sensor are described herein.

One advantageous further refinement of the micromechanical z-inertial sensor is distinguished in that the first function layer and the third function layer are developed with different thicknesses. This makes it possible to utilize for the production of the provided z-inertial sensor a production method for producing defined layer thicknesses, the spring geometries of the first and the second spring elements being suitably adapted.

A characteristic feature of another advantageous further refinement of the micromechanical z-inertial sensor is that the first function layer and the third function layer are developed at the same thickness. This provides an alternative production method for the micromechanical z-inertial sensor.

Another characteristic feature of an advantageous further refinement of the micromechanical z-inertial sensor is that superposed spring elements of the first and the third function layers have geometrically different developments or have geometrical developments. This advantageously makes it possible to compensate for or to realize suitable characteristics of the spring elements in all layer thicknesses of the first and the third function layer through the shaping.

Another characteristic feature of an additional advantageous further refinement of the micromechanical z-inertial sensor is that suspension points of the spring elements on the movable MEMS structure and on the substrate are placed in a defined manner in close proximity to one another. At a slight layer thickness, this advantageously makes it possible to largely eliminate an effect of a stress gradient in the spring elements by warping.

Another advantageous further refinement of the micromechanical z-inertial sensor is characterized in that at least a portion of the spring elements is developed as spiral springs. This makes it easy to place the suspension points of the spring elements in close proximity to one another on the substrate and on the seismic mass.

Another advantageous further refinement of the micromechanical z-inertial sensor is characterized in that the spring elements have reinforcement structures at least in sections. This allows for an efficient realization of the desired stiffening of the spring elements in the x- and the y-directions.

Another advantageous further refinement of the micromechanical z-inertial sensor is characterized in that the reinforcement structures are developed in a checkered manner. This provides a particularly efficient reinforcement of the spring elements in the x- and the y-directions.

Below, the present invention is described in detail with further features and advantages with the aid of a plurality of figures. Identical or functionally equivalent elements have been given the same reference numerals. The figures are particularly meant to illustrate the salient principles of the present invention and are not necessarily drawn true to scale. For better clarity, it may be the case that not all reference numerals are shown in in all of the figures.

Disclosed method features similarly result from correspondingly disclosed device features, and vice versa. This particularly means that features, technical advantages and embodiments with regard to the method for producing a micromechanical z-inertial sensor result in a similar manner from corresponding embodiments, features and advantages with regard to the micromechanical z-inertial sensor, and vice versa.

DETAILED DESCRIPTION OF EXAMPLE EMBODIMENTS

In the related art, a large share of the micromechanical z-inertial sensors is developed according to the rocker principle. Rockers have a number of advantages; for example, it is easily possible to realize a differential electrode system in rocker systems. This means that in response to a deflection of the rocker, there is an increase in a first capacitive signal between a seismic mass and a first electrode situated on a first side of the torsion spring of the rocker. A second capacitive signal between the seismic mass and a second electrode situated on a second side of the torsion spring of the rocker decreases, and a geometrical deflection of the rocker is ascertained based on the two mentioned capacitive signals.

A torsion spring of the rocker is developed in a thick polysilicon function layer. Mechanical properties of this layer are adjustable quite well in terms of process engineering so that in particular a stress gradient, i.e. an internal stress distribution of the layer, is able to be adjusted in such a way that long springs are realizable, which barely bend in the z-direction. The thinner the development of the polysilicon layers, the more difficult it becomes to adjust a low stress gradient. In addition, z-sensors that are developed as rockers usually exhibit low cross sensitivity.

In accordance with the present invention, advantages of the conventional rocker principle are transferred to an alternative development of a micromechanical z-inertial sensor.

Figure 1:
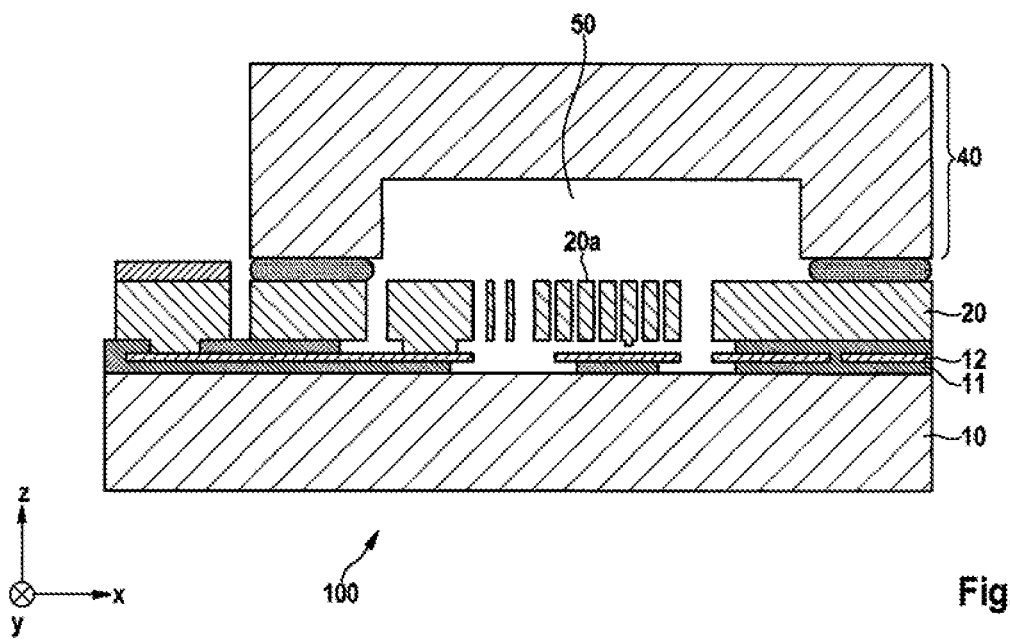
FIG. 1 shows a cross-sectional view of a conventional micromechanical inertial sensor.

FIG. 1 illustrates that acceleration sensors often have movable MEMS structures 20a, which are etched out of a thick micromechanical second function layer 20 made of polysilicon. They are placed above a thin buried first function layer 12 made of polysilicon, which in turn is attached by an oxide layer 11 to a substrate 10. An oxide layer is also provided between the two function layers 12, 20.

Buried first function layer 12 of polysilicon is used as an electric circuit trace and/or as an electrode. Second micromechanical function layer 20 is exposed via a trenching process and an oxide sacrificial layer method. Buried first function layer 12 is electrically separated from substrate 10 via an oxide layer 11. The circuit traces and electrodes have a width such that they are not fully undercut in the oxide sacrificial oxide etching step and are thereby attached to substrate 10 in a stable manner.

In most cases, movable MEMS structures 20a ("seismic mass") produced in such a manner are sealed by a cap wafer 40 in the further process sequence. Depending on the use, a suitable internal pressure is enclosed within volume 50 sealed thereby, the seal in most cases being implemented via a seal-glass bonding method or via a eutectic bonding method, e.g., using AlGe.

Figure 2:
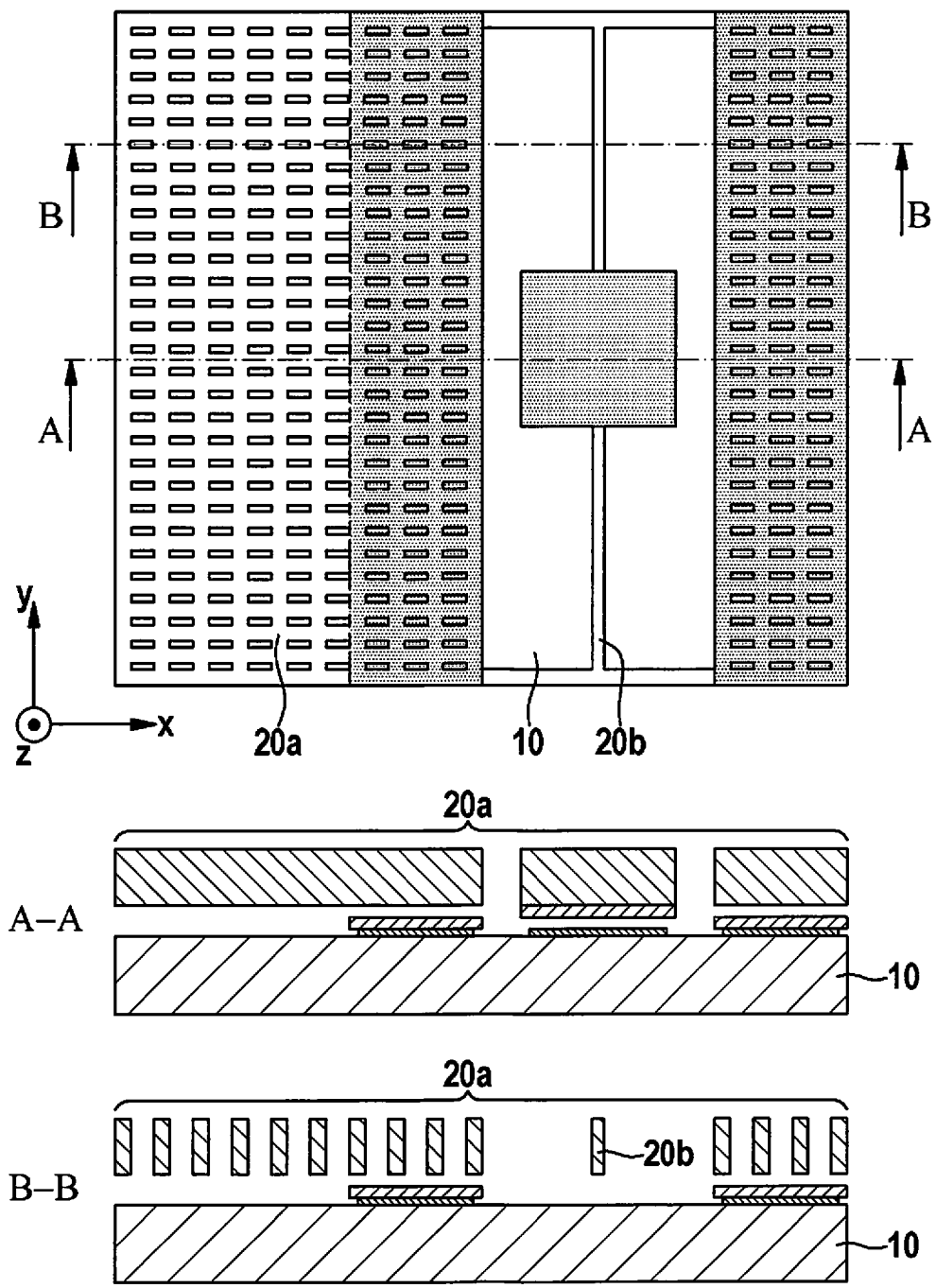
FIG. 2 shows views of a conventional micromechanical z-inertial sensor.

In order to produce a z-acceleration sensor in such a production process, a rocker structure is developed in second micromechanical function layer 20, which is attached to substrate 10 via torsion springs 20b, as sketched in FIG. 2. The mass distribution of the rocker structure has an asymmetrical development, and two electrode surfaces are situated below the rocker structure in order to capacitively detect a deflection of the rocker structure with the aid of measuring technology.

One disadvantage of this system may be that an increase in sensitivity is unable to be achieved in this type of sensor when the thickness of second micromechanical function layer 20 is increased. It is true that through the increase in thickness, the force applied at the rocker is linearly increased with the change in the thickness. However, the stiffness of the torsion spring becomes simultaneously greater with the third power of the thickness, which is why torsion spring 20b must have a thinner development, which is possible only to a limited extent during the production process and only with considerable disadvantages.

In the case of x- and y-sensors, it is also possible to increase the sensitivity without changing the spring widths, via an increase in the thickness of second function layer 20. Since combined xyz-sensors are produced in one process these days, a value must be selected for the thickness of second function layer 20 that allows neither for a z-sensor nor corresponding xy-sensors having optimum sensitivity.

Another disadvantage of the system from FIG. 2 is that when the asymmetry is further increased in the mass distribution of these sensors in an effort to increase the sensitivity, the fixed counter-electrodes must simultaneously be made smaller, which means that the electric signal is disadvantageously reduced.

Thus, in accordance with the present invention, a function and detection principle for a z-sensor are allowed which deviates from a rocker and which allows for better z-sensors that exhibit greater sensitivity and are able to be produced in an uncomplicated manner in a single production process together with highly sensitive xy-sensors.

FIG. 3 shows multiple views of a specific embodiment of a provided micromechanical z-inertial sensor 100.

Figure 3A:
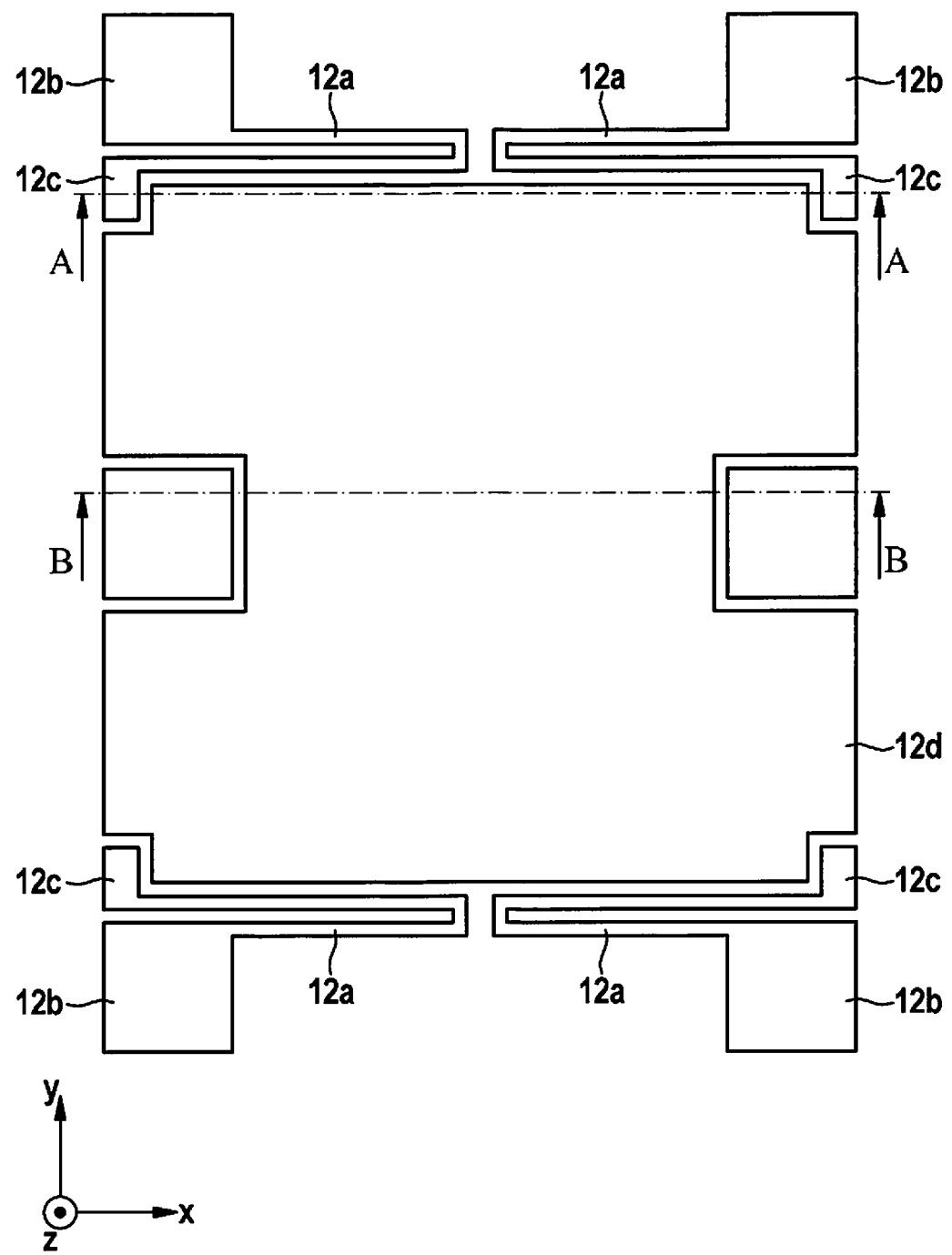
FIG. 3a-3e shows multiple views of a first specific embodiment of a provided micromechanical z-inertial sensor.
Figure 3B:
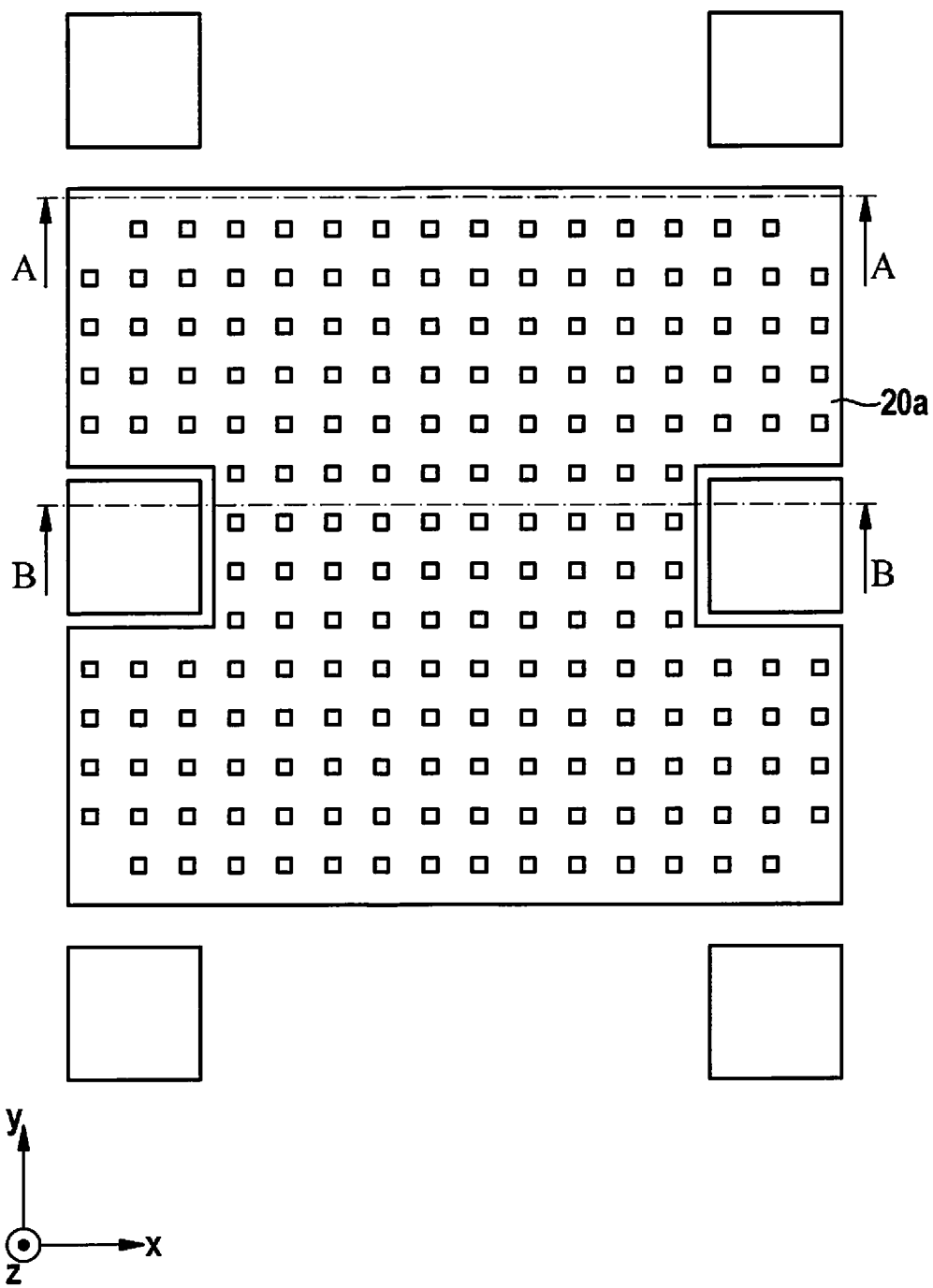
Figure 3C:
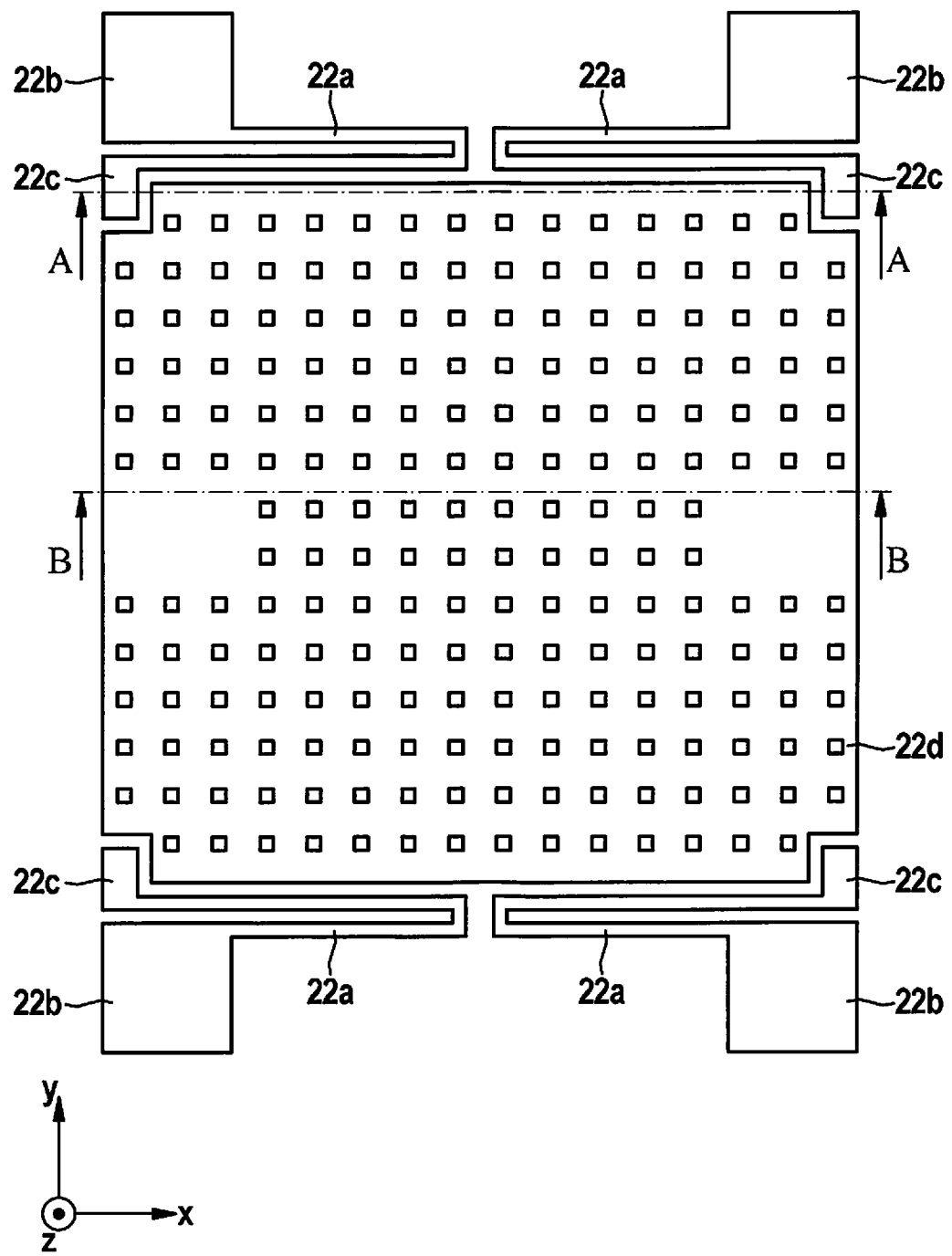
Figure 3D:
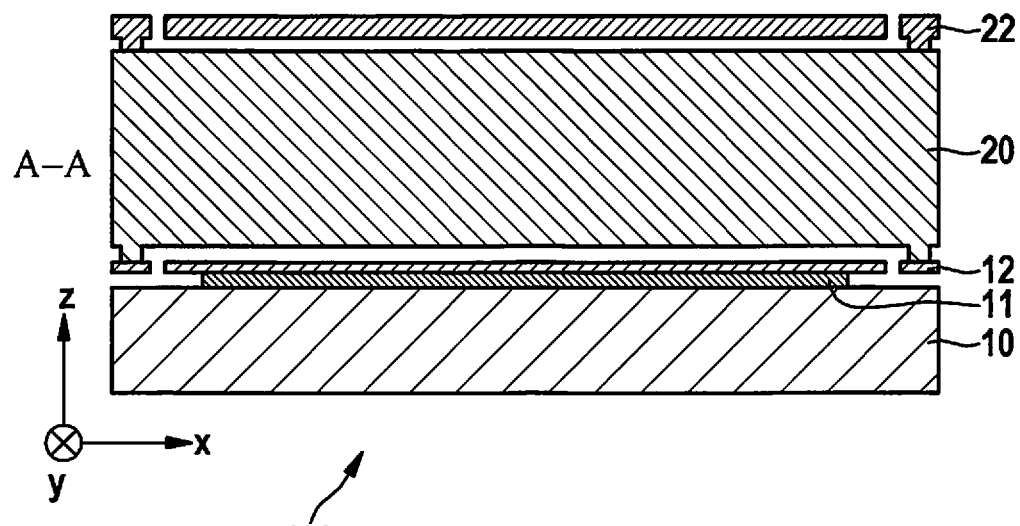
Figure 3E:
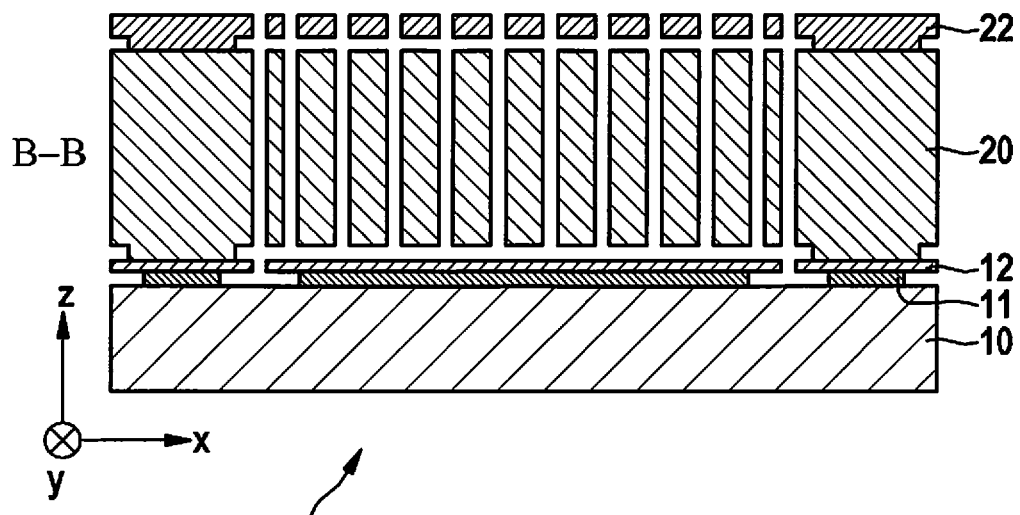

Three plan views are shown in FIGS. 3a through 3c, and two cross-sectional views are shown in FIGS. 3d and 3e. It is provided to suspend seismic mass 20a with the aid of flat, leaf-spring-like spring elements 12a, 22a, which are disposed both below (FIG. 3a) and above (FIG. 3c) the seismic mass 20a. It is furthermore provided to furnish a fixed electrode 12d, 22d below (FIG. 3a) and above (FIG. 3c) seismic mass 20a, via which the mechanical deflection of seismic mass 20a is able to be detected.

The cross-sectional views of FIGS. 3d, 3e show micromechanical z-inertial sensor 100 along sectional lines A-A and B-B. It can be seen there that provided z-inertial sensor 100 is produced by depositing on a substrate 10 a first thin function layer 12 of polysilicon, then a second, thick micromechanical function layer 20, followed by a third, additional thin function layer 22 of polysilicon.

It is preferably provided to realize both spring elements 12a, 22a and also fixed electrodes 12d, 22d in function layers 12, 22. In principle, only seismic mass 20a is realized in second, thick function layer 20.

Spring elements 12a of first function layer 12 are connected to substrate 10 on one side at a connection point 12b, and on a second side they are connected to seismic mass 20a with the aid of a second connection point 12c.

Spring elements 22a of third function layer 22 are connected to substrate 10 on one side at a connection point 22b, and on a second side, they are connected to seismic mass 20a with the aid of a second connection point 22c.

In their geometrical form, spring elements 12a, 22a are developed in such a way that a clearance between respective connection points 12b, 12c and 22b, 22c is clearly smaller than a geometrical length of spring elements 12a, 22a. The spatial proximity of the suspension points advantageously makes it easier to reduce negative effects of a mechanical preloading of spring elements 12a, 22a as a result of a stress gradient.

Figure 4:
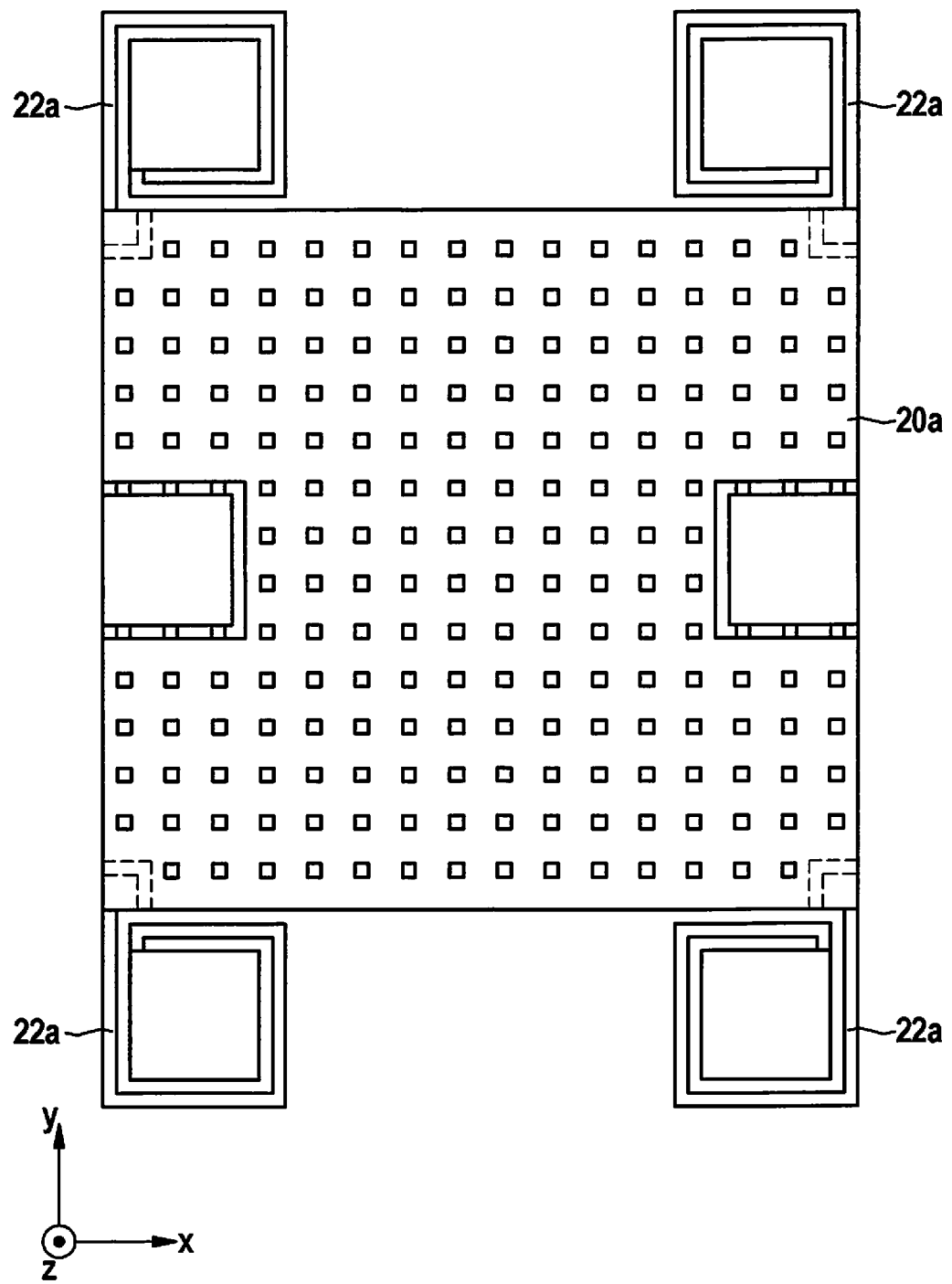
FIG. 4 shows a plan view of a further specific embodiment of a provided micromechanical z-inertial sensor.

The spatial proximity of the two connection points of spring element 22a may be gathered very clearly from FIG. 4, which illustrates a further specific embodiment of micromechanical z-inertial sensor 100. It can be seen that connection points of spring element 22a, which is developed as a spiral spring, to substrate 10 and seismic mass 20a are placed in very close proximity, a clearance of the connection points of spring element 22a from one another preferably amounting to less than one half the length of spring element 22a.

Thus, it can be seen that in the specific embodiments of FIG. 3 and FIG. 4, a fixed electrode 12d is situated below seismic mass 20a and a fixed electrode 22d is situated above seismic mass 20a. In response to an acceleration in the z-direction, seismic mass 20a is deflected parallel to the z-direction, so that the differential evaluation concept between the two fixed electrodes 12d, 22d known from the rocker system advantageously remains unchanged.

Sensors having a small design are advantageously able to be produced at an identical basic capacity due to the mentioned electrode placement. In addition, a stronger signal change is able to be generated at an identical basic capacity due to the parallel movement of seismic mass 20a relative to fixed electrodes 12d, 22d. During a tilting movement, the electrode regions that lie closer to the tilting axis are subject to a lesser deflection and generate a reduced signal. This disadvantage is advantageously able to be avoided in the proposed z-inertial sensor 100.

It can therefore be gathered that long springs are provided in proposed micromechanical z-inertial sensor 100, whose attachment points on substrate 10 and on seismic mass 20a are placed in close proximity to one another. This also allows spring element 12a, 22a itself to bend under consideration of the stress gradient. However, seismic mass 20a no longer experiences this influence with a decreasing clearance between the mentioned attachment points. This has the advantage that the deflection of spring element 12a, 22a is reduced in a squared manner with the clearance, and or in other words, is able to be reduced to a very large extent, without the need to reduce the clearance to zero.

In the spiral spring system shown in FIG. 4, the absolute deflection of spring element 22a as a result of the stress gradient is also able to be reduced, for instance in order to prevent spring element from making contact with substrate 10 or with seismic mass 20a or from coming too close to them.

A slight cross sensitivity is able to be achieved in two ways in provided micromechanical z-inertial sensor 100. In the simplest approach, spring elements 12a, 22a of layers 12, 22 are configured at an identical stiffness in the z-direction. In particular, the thickness of the two function layers 12, 22 may also be developed in an approximately identical manner for this purpose.

According to a second approach, the stiffness of spring elements 12, 22 of the two function layers 12, 22 is configured considerably stiffer in the x- and y-directions than in the z-direction. This effectively makes it possible to prevent tilting of seismic mass 20a even at a different spring stiffness of spring elements 12a, 22a. In order to achieve this, it is especially provided to develop spring elements 12a, 22a in the two function layers 12, 22 whose width is greater than their thickness in broad regions (i.e., the layer thickness of function layers 12, 22).

Figure 5:
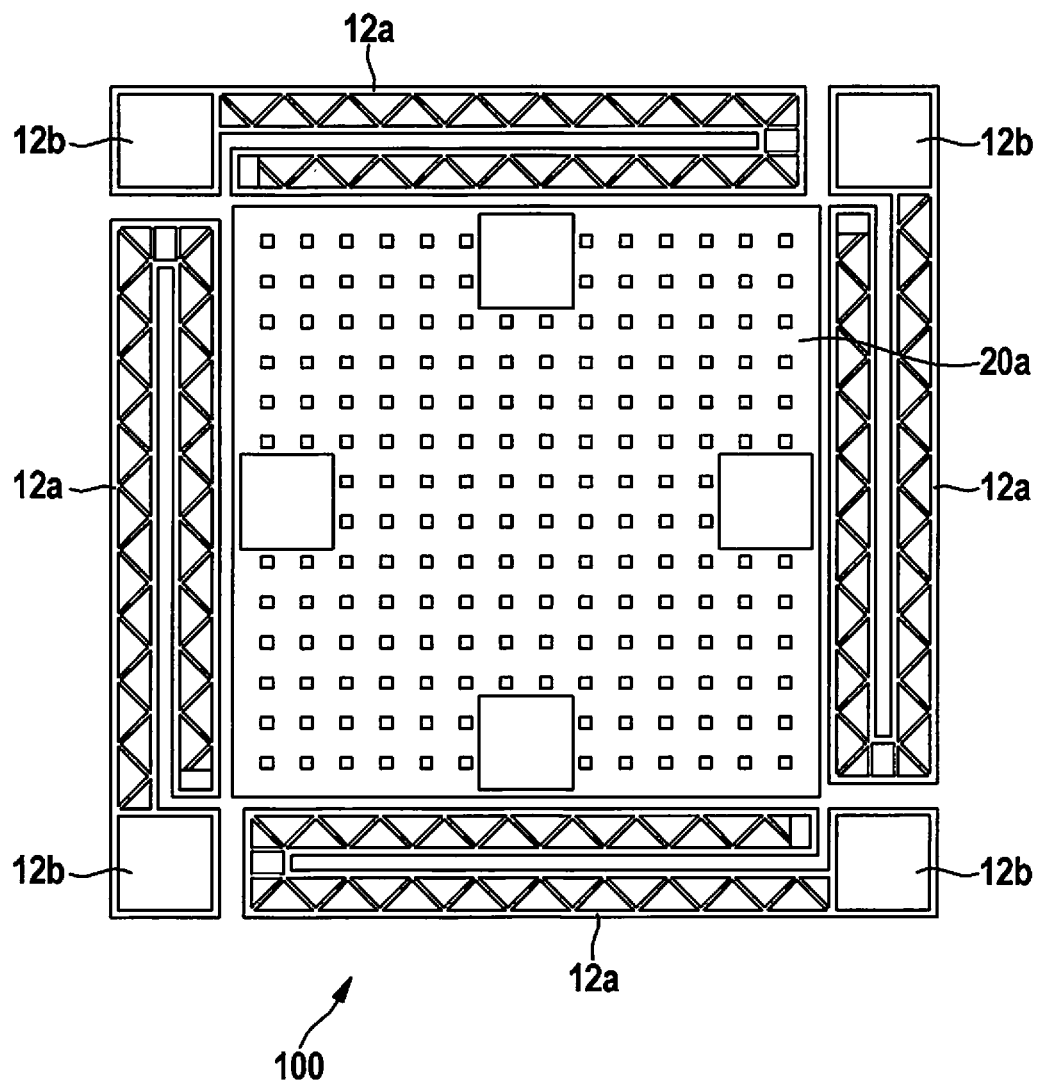
FIG. 5 shows a plan view of a further specific embodiment of a provided micromechanical z-inertial sensor.

In addition, it is provided to use spring elements that have a checkered structure, as shown in FIG. 5. Depending on the marginal condition and the production process, the two mentioned approaches may be used individually or in combination.

In the variant of micromechanical z-inertial sensor 100 including spring elements 12a shown in FIG. 5, it can be seen that they include checkered reinforcement structures. However, it is of course understood that these are merely of an exemplary nature and reinforcement structures that have a different geometrical development within spring elements 12a, 22a are also possible, which, for example, may be developed in meander form, planar, or rounded form, etc. (not shown).

In contrast to a classic z-sensor, spring elements 12a, 22a are placed below and above seismic mass 20a in the x- and y-directions in the proposed concept. This advantageously makes it possible to realize sensitive sensors that have a very small design.

Figure 6:
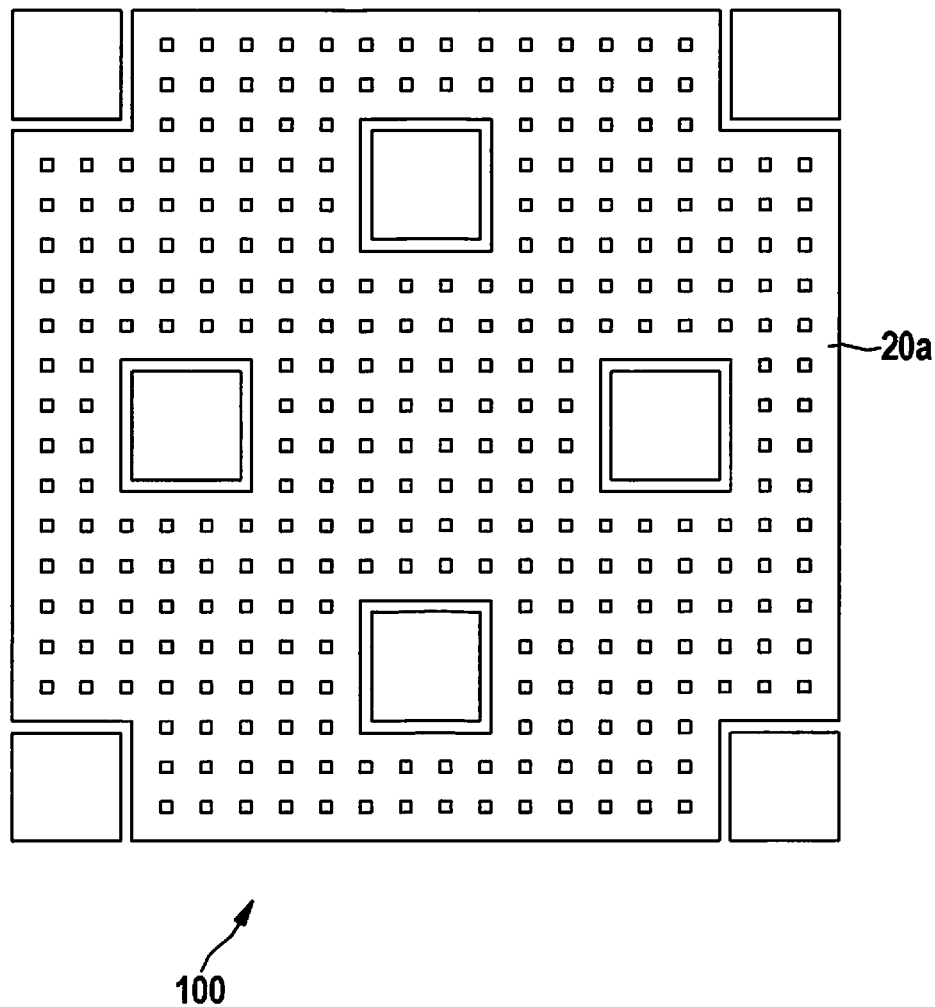
FIG. 6 shows a plan view of a further specific embodiment of a provided micromechanical z-inertial sensor.

FIG. 6 shows a plan view of a seismic mass 20a of a further specific embodiment of micromechanical z-inertial sensor 100.

The mechanical sensitivity of provided micromechanical z-inertial sensor 100 linearly increases with the thickness of second function layer 20. The mechanical sensitivity of micromechanical z-inertial sensor 100 may be selected independently of the thickness of second function layer 20 of seismic mass 20a via the thickness of first function layer 12 and third function layer 22.

However, the mechanical sensitivity of the provided micromechanical z-inertial sensor may be adjusted not only via the thickness but also via the selection of the geometry of spring elements 12a, 22a in function layers 12, 22. The geometry of spring elements 12a, 22a in first and third function layers 12, 22 is able to be selected in combination with the thickness of these layers 12, 22, in such a way that a sensor is provided that is soft in the z-direction, but has a very hard suspension with regard to movements in the substrate plane (i.e., in the x- and y-directions). As a result, this makes it possible to produce more sensitive and smaller micromechanical z-sensors.

In an advantageous manner, it is also possible to realize combined xyz-sensors (not shown) in which the individual sensors may be configured considerably closer to their optimum operating point. Because of the provided spring shape, the thicknesses of first and third function layers 12, 22 may also be selected very low even if the thin layer has a high stress gradient.

The provided system is able to be used not only for z-sensors that measure a z-acceleration externally applied at a component but also for sensors that measure an internal z-acceleration. For example, the system may also be used in a yaw-rate sensor in which a Coriolis acceleration in the z-direction is measured in a substructure.

Using the provided micromechanical z-inertial sensor, it is advantageously possible to largely avoid adhesion effects in cross-loading.

Figure 7:
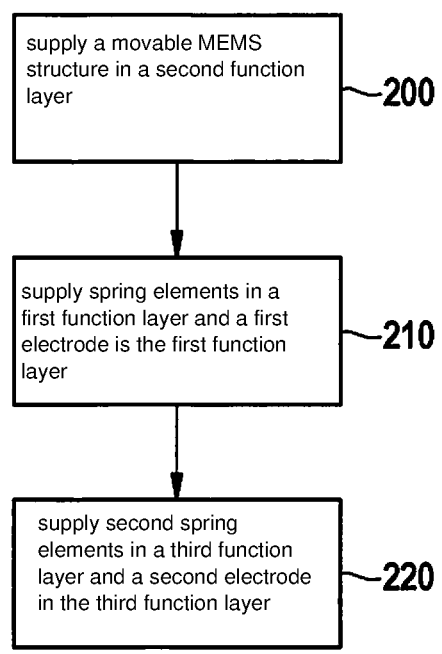
FIG. 7 shows a basic sequence of a method for producing a provided micromechanical z-inertial sensor.

FIG. 7 shows a basic sequence of the provided method for producing a micromechanical z-inertial sensor 100.

In a step 200, a supply of a movable MEMS structure 20a developed in a second function layer 20 is implemented.

In a step 210, a supply of spring elements 12a developed in a first function layer 12, and of a first electrode 12d developed in first function layer 12, is implemented, the first spring elements 12a being connected to movable MEMS structure 20a and to a substrate 10, and first function layer 12 being situated below second function layer 20.

In a step 220, a supply of second spring elements 22a, which are developed in a third function layer 22, and a second electrode 22d, developed in third function layer 22, is implemented, second spring elements 22a being connected to movable MEMS structure 20a and to substrate 10, and third function layer 22 being situated above second function layer 20, movable MEMS structure 20a being deflectable in a z-direction with the aid of spring elements 12a, 22a and, in a defined manner, not being deflectable in the x- and y-directions.

Although the present invention has been described in the previous text on the basis of specific exemplary embodiments, one skilled in the art may also realize embodiments that have not been disclosed or that have been disclosed only partially, without departing from the core of the present invention.

What is claimed is:

1. A micromechanical z-inertial sensor, comprising:
a movable MEMS structure in a second function layer;
first spring elements in a first function layer, and a first electrode in the first function layer, the first spring elements being connected to the movable MEMS structure and to a substrate, and the first function layer being situated below the second function layer; and
second spring elements in a third function layer, and a second electrode in the third function layer, the second spring elements being connected to the movable MEMS structure and to the substrate, and the third function layer being situated above the second function layer;
wherein the movable MEMS structure is deflectable in the z-direction with the aid of the spring elements, and in a defined manner, is not deflectable in the x- and y-directions.

2. The micromechanical z-inertial sensor as recited in claim 1, wherein the first function layer and the third function layer have different thicknesses.

3. The micromechanical z-inertial sensor as recited in claim 1, wherein the first function layer and the third function layer have the same thickness.

4. The micromechanical z-inertial sensor as recited in claim 1, wherein superposed spring elements of the first and third function layer have a geometrically different.

5. The micromechanical z-inertial sensor as recited in claim 1, wherein suspension points of the spring elements on the movable MEMS structure and on the substrate are disposed in a defined manner in close proximity to one another.

6. The micromechanical z-inertial sensor as recited in claim 1, wherein the spring elements are at least sectionally spiral springs.

7. The micromechanical z-inertial sensor as recited in claim 1, wherein the spring elements have reinforcement structures at least in sections.

8. The micromechanical z-inertial sensor as recited in claim 7, wherein the reinforcement structures have a checkered development.

9. The micromechanical z-inertial sensor as recited in claim 1, wherein superposed spring elements of the first and third function layer have a geometrical form.

10. A method for producing a micromechanical z-inertial sensor, the method comprising:
providing a movable MEMS structure in a second function layer;
providing first spring elements in a first function layer, and a first electrode in a first function layer, the first spring elements being connected to the movable MEMS structure and to a substrate, and the first function layer being situated below the second function layer;
supplying second spring elements, which are in a third function layer, and a second electrode, which is in the third function layer, the second spring elements being connected to the movable MEMS structure and to the substrate, and the third function layer being situated above the second function layer;
wherein the movable MEMS structure is deflectable in the z-direction with the aid of the spring elements and, in a defined manner, is not deflectable in the x- and y-directions.

* * * * *